US009000846B2

(12) United States Patent
Lee (10) Patent No.: US 9,000,846 B2
(45) Date of Patent: Apr. 7, 2015

(54) CURRENT MIRROR (71) Applicant: VIA Technologies, Inc., New Taipei (TW)

(72) Inventor: Yeong-Sheng Lee, Fremont, CA (US)

(73) Assignee: VIA Technologies, Inc., New Taipei (TW)

( * ) Notice: Subject to any disclaimer, the term of this patent is extended or adjusted under 35 U.S.C. 154(b) by 53 days.

(21) Appl. No.: 13/939,325

(22) Filed: Jul. 11, 2013

(65) Prior Publication Data

US 2014/0361835 A1 Dec. 11, 2014

Related U.S. Application Data (63) Continuation-in-part of application No. 13/915,017, filed on Jun. 11, 2013, now abandoned.

(51) Int. Cl.
*H03F 3/04* (2006.01)
*H03F 3/345* (2006.01)

(52) U.S. Cl.
CPC .......... *H03F 3/345* (2013.01); *H03F 2200/91* (2013.01)

(58) Field of Classification Search
CPC ................ H03F 2200/91; H03F 2200/474

USPC .................. 330/257, 288; 323/315, 316
See application file for complete search history.

(56) References Cited

U.S. PATENT DOCUMENTS

| 6,064,267 | A  | * | 5/2000 | Lewyn ................... 330/288 |
| 6,617,915 | B2 |   | 9/2003 | Rajan |
| 7,230,474 | B2 |   | 6/2007 | Yamamoto et al. |
| 8,169,834 | B2 |   | 5/2012 | Wang et al. |

FOREIGN PATENT DOCUMENTS

| CN | 1627223 A   | 6/2005 |
| CN | 101630532 A | 1/2010 |

* cited by examiner

*Primary Examiner* — Steven J Mottola
(74) *Attorney, Agent, or Firm* — McClure, Qualey & Rodack, LLP (57) ABSTRACT Some embodiments of the system comprise a current mirror with two switches (a first switch and a second switch) and two compensation circuits (a first compensation circuit and a second compensation circuit). In one embodiment, the first compensation circuit adjusts a drain voltage of the second switch based on a drain voltage of the first switch, and the second compensation circuit adjusts a current through the first switch based on the drain voltage of the second switch.

9 Claims, 7 Drawing Sheets

CURRENT MIRROR

CROSS-REFERENCE TO RELATED APPLICATION

This application is a continuation-in-part of prior application Ser. No. 13/915,017, filed on Jun. 11, 2013, having the title "Current Mirror," which is incorporated by reference in its entirety as if expressly set forth herein.

BACKGROUND

1. Field of the Disclosure

The present disclosure relates generally to circuits and, more particularly, to systems and methods for mirroring current.

2. Description of Related Art

As technology for metal-oxide semiconductor (MOS) fabrication advances, the power supply voltage can correspondingly decrease. However, a continued decrease in power supply voltage creates its own drawbacks. Thus, a heretofore unaddressed need exists in the industry to address the aforementioned deficiencies and inadequacies.

SUMMARY

The present disclosure provides systems and methods for mirroring current. Briefly described, in architecture, one embodiment of the system comprises a current mirror with two switches (a first switch and a second switch) and two compensation circuits (a first compensation circuit and a second compensation circuit). In one embodiment, the first compensation circuit adjusts a drain voltage of the second switch based on a drain voltage of the first switch, and the second compensation circuit adjusts a current through the first switch based on the drain voltage of the second switch.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE EMBODIMENTS

As technology for metal-oxide semiconductor (MOS) fabrication advances, power supply voltages continue to decrease. However, when the power supply voltage (VDD) becomes sufficiently low (e.g., approximately one volt or two volts), headroom becomes important. In the case of current mirrors, a low VDD can result in degradation of the mirroring effect. An example of this degradation can be seen with reference to FIGS. 1 and 5.

Figure 1:
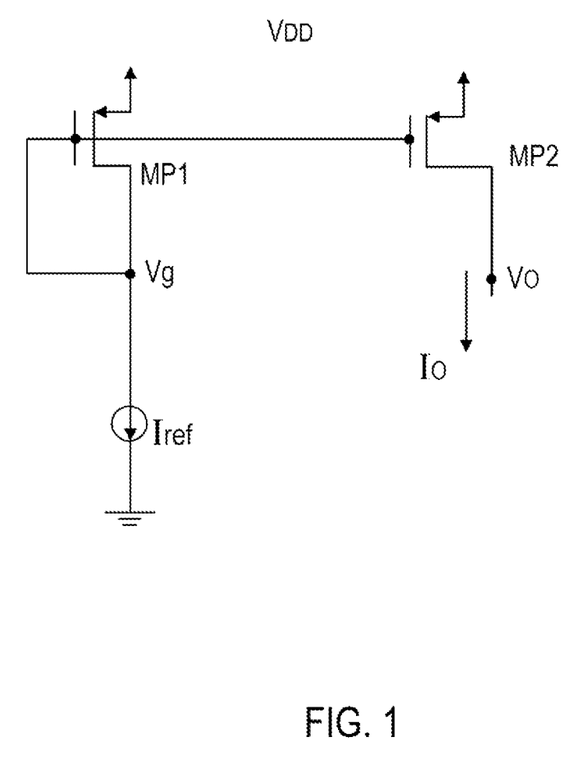
FIG. 1 is a circuit diagram showing one embodiment of a current mirror.

Specifically, FIG. 1 shows a circuit diagram showing one embodiment of a current mirror. As shown in FIG. 1, the current mirror comprises a first transistor (MP1) having a gate, a source, and a drain. The drain of MP1 is electrically coupled to a current source (Iref). The gate of MP1 is also electrically coupled to a second transistor (MP2), which also has a gate, a source, and a drain. The gates of MP1 and MP2 are electrically coupled in such a way that the gate voltages (Vg) are determined by as a function of Iref, and a mirrored current (Io) is generated at the drain of MP2, along with a corresponding output voltage (Vo) at the drain of MP2. As one having skill in the art will appreciate, Iref can be mirrored to many local circuits through additional, similar mirror branches.

In the circuit of FIG. 1, if Vo is low compared to Vg, then MP2 enters a saturation region, thereby maintaining proper current mirroring. Conversely, if Vo continues to increase, then at some point MP2 enters a linear region where the mirroring effect degrades. One example of this degradation is shown with reference to FIG. 5, which shows a simulation of the current mirror of FIG. 1.

Figure 5:
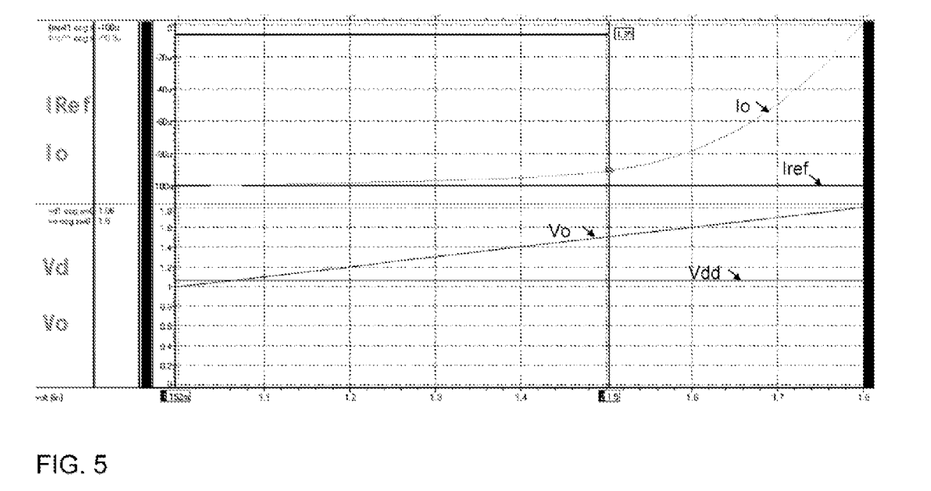
FIG. 5 is a chart showing a simulation of one embodiment of a current mirror.

In the simulation of FIG. 5, Iref is set to approximately 100 micro-amperes (~100 μA) and VDD is set to approximately 1 Volt (~1V). As shown in FIG. 5, as Vo is swept from ~1V to ~1.8V, the current matching error changes. Specifically, between the Vo range of ~1V to ~1.5V, the error is within approximately ten percent (~10%). However, as Vo increases beyond ~1.5V, the mismatch increases dramatically and reaches ~50% error at Vo of ~1.7V.

The embodiments described herein seek to reduce these types of current mismatches by employing compensation circuits. For example, some embodiments provide a current-compensation system for a current mirror with two switches (a first switch and a second switch). In some embodiments, the current-compensation system comprises two compensation circuits (a first compensation circuit and a second compensation circuit), where the first compensation circuit adjusts a drain voltage of the first switch based on a drain voltage of the second switch, and the second compensation circuit adjusts a current through the first switch based on the drain voltage of the second switch. By adjusting the appropriate drain voltages at each switch, the current-compensation system provides a mechanism that maintains current matching through a larger range of Vo.

With this overview of the current-compensation system in mind, reference is now made in detail to the description of the embodiments as illustrated in the drawings. While several embodiments are described in connection with these drawings, there is no intent to limit the disclosure to the embodiment or embodiments disclosed herein. On the contrary, the intent is to cover all alternatives, modifications, and equivalents.

Figure 2A:
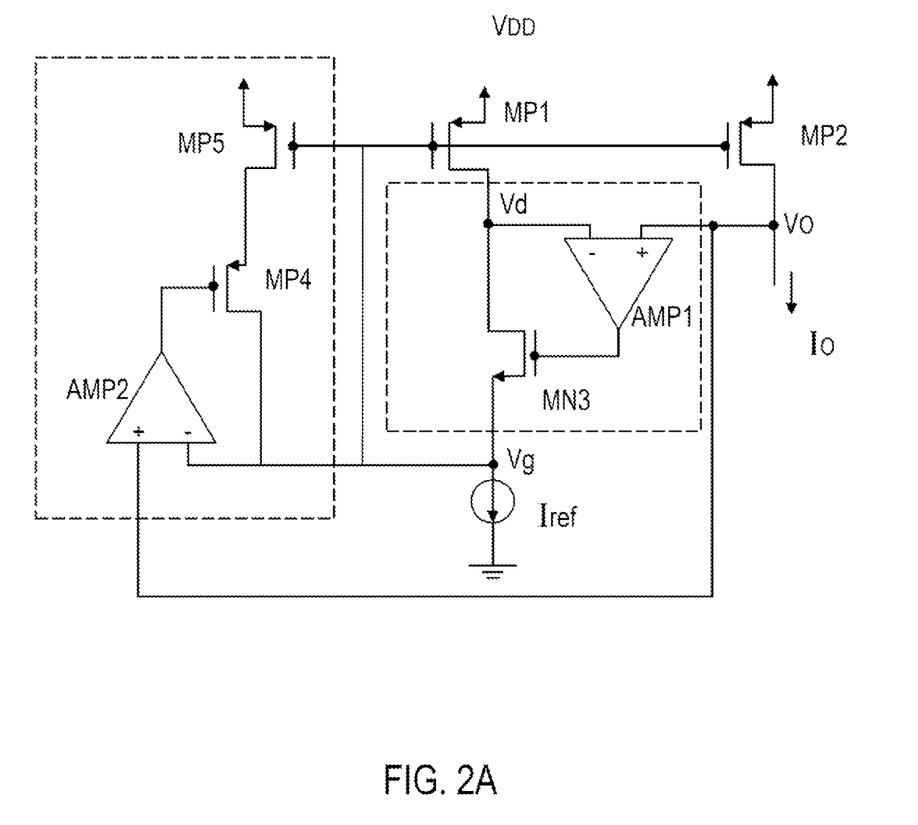
FIG. 2A is a circuit diagram showing one embodiment of a current mirror with a compensation circuit.

FIG. 2A is a circuit diagram showing one embodiment of a current-compensation system. For purposes of clarity, the embodiment of FIG. 2A is described using field-effect transistors (FET), and specifically metal-oxide semiconductor (MOS) FET technology. However, it should be appreciated that the system can be implemented using other technologies, such as bipolar junction transistors (BJT) or other equivalent structures.

As shown in FIG. 2A, the system comprises a first transistor (MP1), which is shown as a positive MOS (PMOS) with a first gate, a first source, and a first drain. The first source is electrically coupled to a voltage source (VDD), and has a drain voltage (Vd) at the first drain (of MP1). The system also comprises a second transistor (MP2, also shown as PMOS) with a second gate, a second source, and a second drain. Here, the second source (of MP2) is electrically coupled to VDD, and the second gate (of MP2) is electrically coupled to the first gate (of MP1). The system further comprises a third transistor (MN3), which is shown as a negative MOS (NMOS). MN3 has a third gate, a third source, and a third drain, with the third drain (of MN3) being electrically coupled to the first drain (of MP1). MP1, MP2, and MN3 are electrically coupled to a first amplifier (AMP1), which is shown as a differential amplifier. AMP1 comprises a first input (shown as a negative input to AMP1), a second input (shown as a positive input to AMP1), and a first output. The negative input (of AMP1) is electrically coupled to the first drain (of MP1), the positive input (of AMP1) electrically coupled to the second drain (of MP2), and the first output (of AMP1) is electrically coupled to the third gate (of MN3). The third source (of MN3) is electrically coupled to a current source (Iref).

In this particular configuration, MP2 has an output voltage (Vo) at its drain, and produces a mirrored current (Io). As a result of a virtual short between the positive input and the negative input of AMP1, Vo tracks Vd. Thus, even when Vo increases, the current of MP2 is matched to the current of MP1. In other words, unlike the embodiment of FIG. 1 where there is a large current mismatch when Vo increases beyond ~1.5V, the embodiment of FIG. 2A maintains a close current match even when Vo increases to ~1.7V.

On the lower range of voltages, when Vo falls below ~1V, the current mirror experiences channel modulation effects. Thus, when Vo is very low, the output of AMP1 becomes high and activates MN3 with a very low resistance. When this occurs, the feedback loop gain becomes too low to maintain a closed-loop response, thereby producing an open-loop response and, consequently, eliminating the virtual short between Vo and Vd. This consequently results in a current mismatch at the lower voltage ranges. However, this lower-voltage-range mismatch can be reduced by using a second amplifier (AMP2, which is shown as a differential amplifier), a fourth transistor (MP4, which is shown as a PMOS), and a fifth transistor (MP5, which is also shown as a PMOS), all of which are shown in FIG. 2A.

Continuing with FIG. 2A, AMP2 comprises a third input (shown as a negative input to AMP2), a fourth input (shown as a positive input to AMP2), and a second output. The third input is electrically coupled to the third source (of MN3), and the fourth input is electrically coupled to the second drain (of MP2). MP4 comprises a fourth gate, a fourth source, and a fourth drain. The fourth gate (of MP4) is electrically coupled to the second output (of MP2), while the fourth drain (of MP4) is electrically coupled to the third source (of MN3). MP5 comprises a fifth gate, a fifth source, and a fifth drain. The fifth gate (of MP5) is electrically coupled to the first gate (of MP1), the fifth source (of MP5) is electrically coupled to VDD, and the fifth drain (of MP5) is electrically coupled to the fourth source (of MP4).

As noted above, the combination of AMP2, MP4, and MP5 provides current compensation for when Vo is low. Specifically, at the lower voltage ranges when channel modulation occurs, the current in MP2 increases. Being a differential amplifier, AMP2 detects the increased current and activates MP4, which divides a portion of Iref from MP1. Consequently, the current in MP1 decreases, thereby resulting in a corresponding decrease in the mirrored current Io from MP2.

One having skill in the art will appreciate that the portion of current that is to be divided may be determined by a ratio (1:N) between the aspect ratios (W/L) of MP1 and MP5, which may be determined based on the product of channel modulation parameters of MP2 and the operative range of Vo. For some embodiments, N will be ~0.1 to ~0.2.

Figure 6:
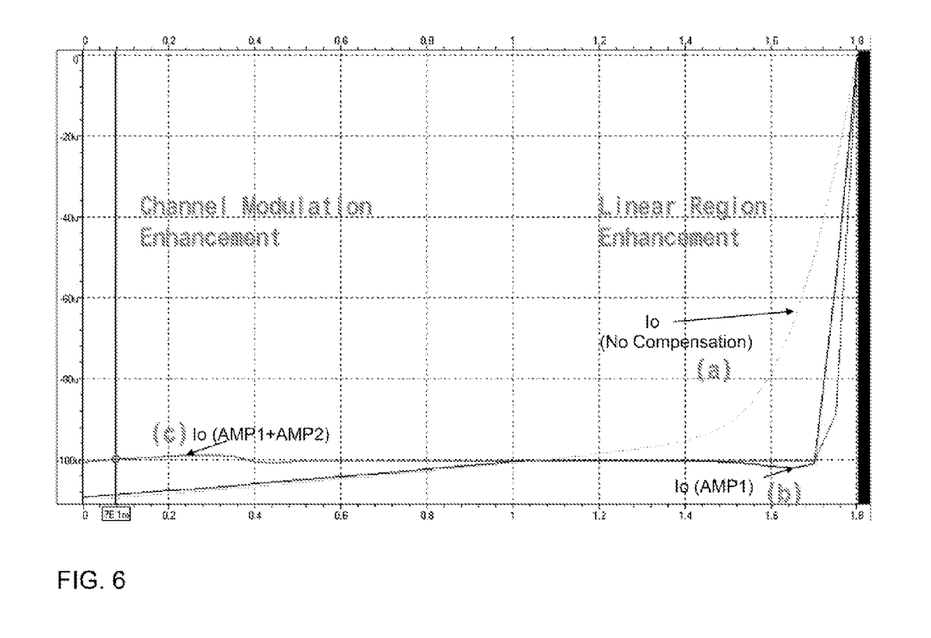
FIG. 6 is a chart showing a simulation of one embodiment of a current mirror with a compensation circuit.

FIG. 6 is a chart showing a simulation of a current mirror with compensation circuits. Specifically, FIG. 6 compares simulation results for: (a) the circuit of FIG. 1; (b) the circuit of FIG. 2A with current compensation using only AMP1 and MN3; and (c) the circuit of FIG. 2A with current compensation using AMP1, MN3, AMP2, MP4, and MP5. As shown in FIG. 6, the uncompensated circuit of FIG. 1 exhibits a large current mismatch when Vo increases beyond ~1.5V. Current compensation using AMP1 and MN3 provides a better current match as Vo increases up to ~1.7V, but shows channel modulation effects below ~1V. When the current is compensated using AMP1, MN3, AMP2, MP4, and MP5, the system exhibits a better current match for Vo between ~0V through ~1.7V, thereby mitigating the channel modulation effects.

Figure 2B:
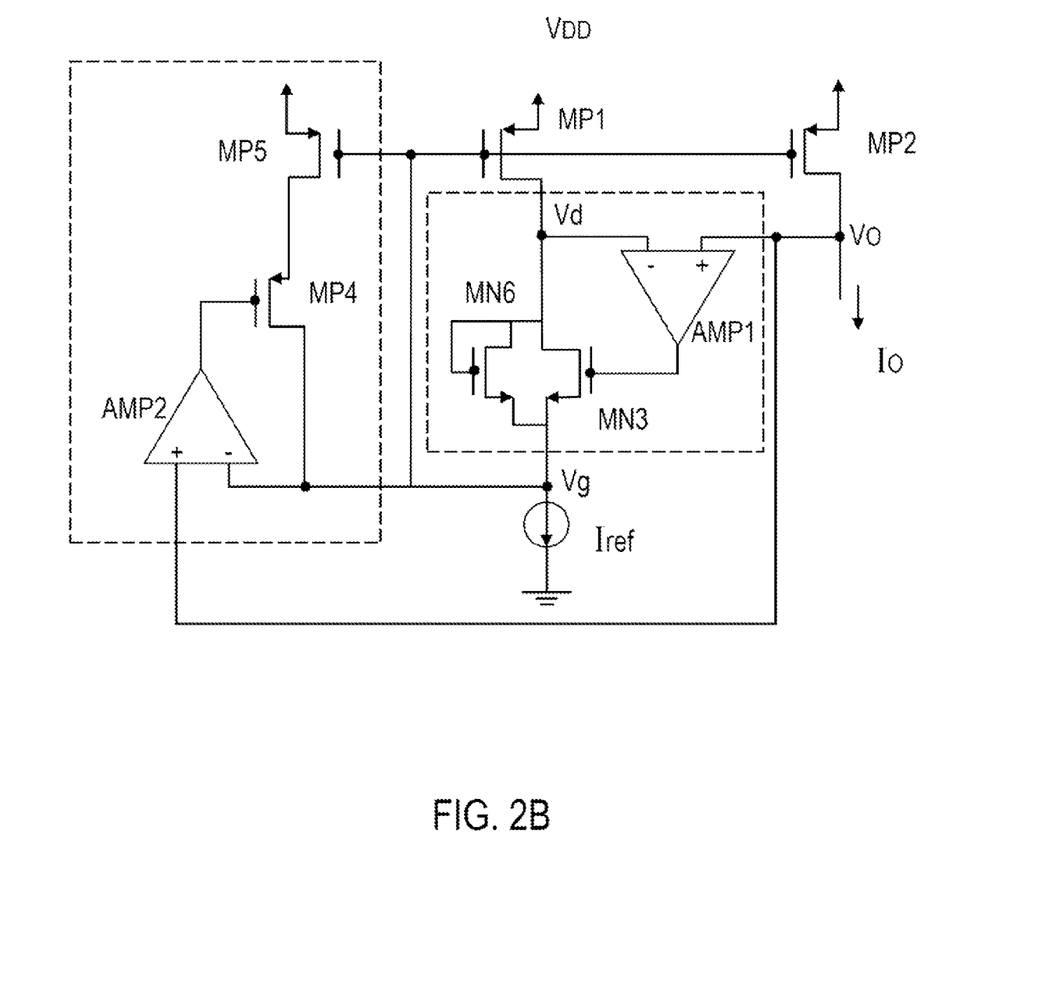
FIG. 2B is a circuit diagram showing another embodiment of a current mirror with a compensation circuit.

In the embodiment of FIG. 2A, when Vo approaches VDD (shown as ~1.8V in FIGS. 5 and 6), the gate voltage (Vg) at MP1 and MP2 becomes very low, which may cause Iref to malfunction. This type of malfunction can be reduced by including a sixth transistor (MN6), as shown in FIG. 2B. Specifically, MN6 (shown as an NMOS) comprises a sixth gate, a sixth source, and a sixth drain. The drain of MN6 is electrically coupled to the gate of MN6, thereby creating a voltage clamp, which clamps the voltage between Vg and Vd, thereby reducing the possibility that Iref will malfunction. Insofar as the other components of FIG. 2B have been described with reference to FIG. 2A, further discussion of those components is omitted with reference to FIG. 2B.

Figure 2C:
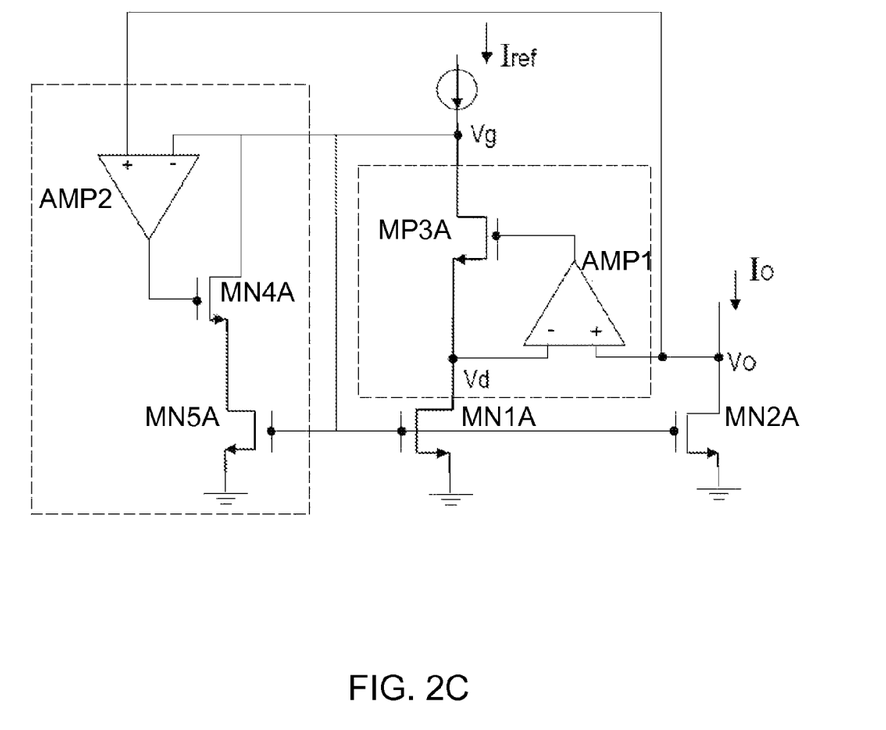
FIG. 2C is a circuit diagram showing yet another embodiment of a current mirror with a compensation circuit.

In another embodiment, as shown in FIG. 2C, by substituting the P-type transistors in FIG. 2A with N-type transistors and the N-type transistors in FIG. 2A with P-type transistors, the mirrored current (Io) may be changed from a supplying current to a sinking current. Since the operation of the circuit in FIG. 2C is comparable to the operation of the circuit in FIG. 2A and readily understandable to those having skill in the art, further description of FIG. 2C is omitted here.

Figure 3:
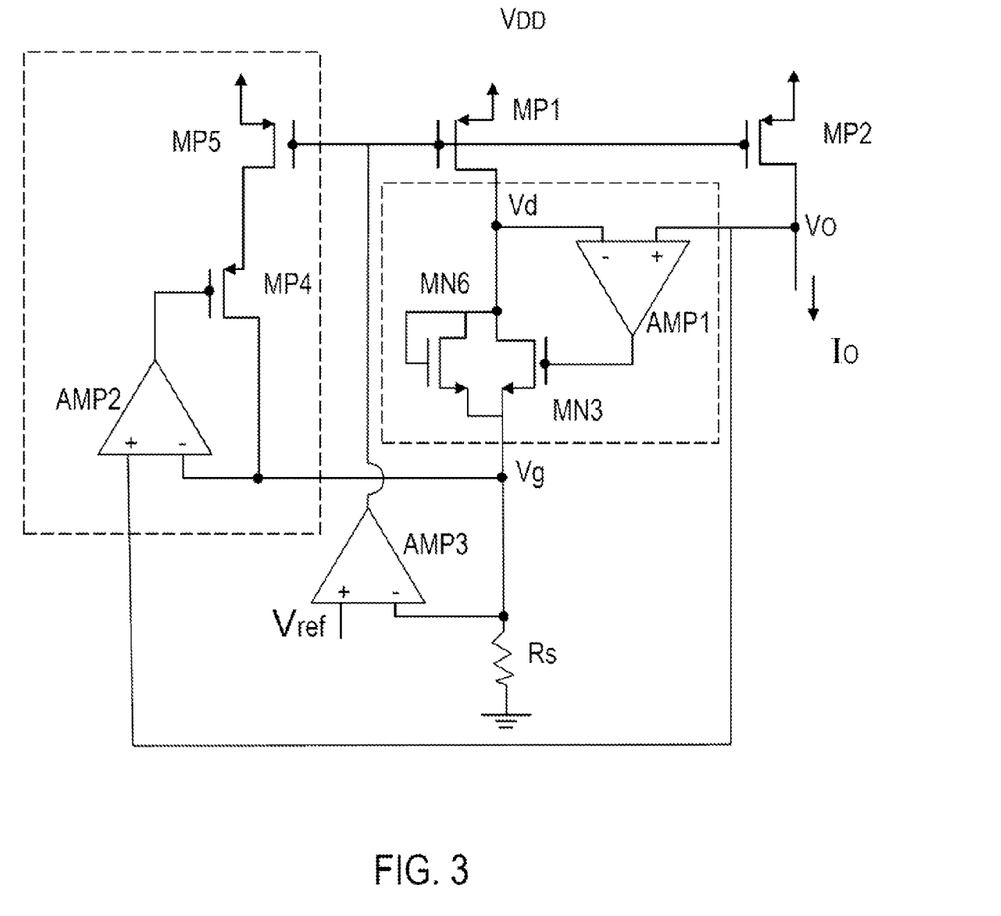
FIG. 3 is a circuit diagram showing yet another embodiment of a current mirror with a compensation circuit.

FIG. 3 is a circuit diagram showing yet another embodiment of a current mirror with a compensation circuit. In particular, FIG. 3 shows one embodiment of Iref being implemented with a third amplifier (AMP3) and a resistor (Rs). AMP3 comprises a fifth input (shown as a negative input to AMP3), a sixth input (shown as a positive input to AMP3), and a third output. The negative input to AMP3 is electrically coupled to the third source (of MN3) and one end of Rs, while the positive input to AMP3 is electrically coupled to a reference voltage (Vref). The other end of Rs is grounded. Consequently, the combination of Vref and Rs produces the current source Iref (=Vref/Rs).

Figure 4:
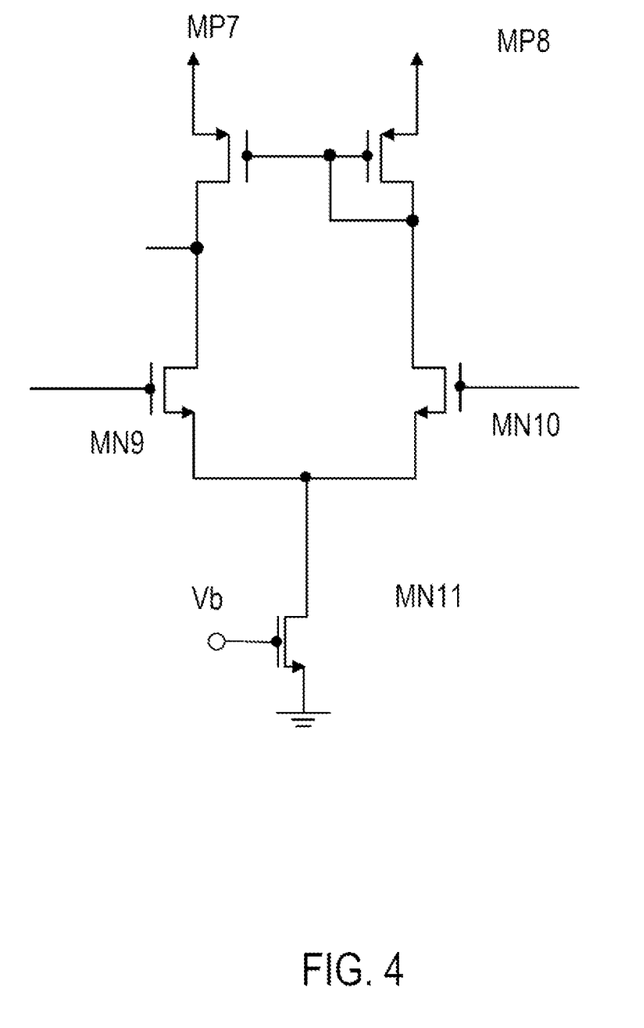
FIG. 4 is a circuit diagram showing one embodiment of an amplifier.

FIG. 4 is a circuit diagram showing one embodiment of an amplifier. Specifically, each of the amplifiers (AMP1, AMP2, and AMP3) can be implemented using MOSFET technology, as shown in FIG. 4. For example, the amplifier can be constructed using two PMOS transistors (MP7 and MP8) and three NMOS transistors (MN9, MN10, and MN11), each with their respective sources, drains, and gates. As shown in FIG. 4, the gate of MP7 is electrically coupled to the gate of MP8, and the gate of MP8 is clamped to the drain of MP8. The drains of MP8 and MN10 are electrically coupled to each other, while the drains of MP7 and MP9 are electrically coupled to each other. The sources of MN9 and MN10 are electrically coupled to the drain of MN11. A bias voltage (Vb) is supplied at the gate of MN11, and the source of MN11 is grounded. The gate of the transistor MN9 acts as the negative input of the amplifier, the gate of the transistor MN10 acts as the positive input of the amplifier, and the drain of the transistor MN9 acts as the output of the amplifier. One having skill in the art should appreciate that the amplifier can be implemented using other known configurations, and that FIG. 4 is intended to show only one embodiment, among others, of an amplifier.

With the detailed description of FIGS. 1 through 6 in mind, it should be appreciated that, although exemplary embodiments have been shown and described, a number of changes, modifications, or alterations to the disclosure as described may be made. For example, while the preferred embodiments of the circuits are shown as being implemented using transistors as switches, it should be appreciated that other types of switches can be implemented for the switches. Additionally, while FET (and more specifically MOSFET) technology is used to describe the transistors, the transistors can also be implemented using bipolar junction transistors (BJT). Thus, the term gate is expressly defined to be a FET gate when the transistor is a FET or MOSFET, but also defined to be a base when the transistor is a BJT. Correspondingly, the term source is expressly defined to be a FET source when the transistor is a FET or MOSFET, but also defined to be an emitter when the transistor is a BJT. Similarly, the term drain is expressly defined to be a FET drain when the transistor is a FET or MOSFET, but also defined to be a collector when the transistor is a BJT. Also, while certain transistors are shown as being either PMOS or NMOS, it should be appreciated by those having skill in the art that the positive and negative terminals may be switched so that the PMOS transistors can be implemented using NMOS, and vice versa. All such changes, modifications, and alterations should therefore be seen as within the scope of the disclosure.

What is claimed is:

1. A circuit, comprising:
   a first transistor, comprising:
      a first gate;
      a first source; and
      a first drain;
   a second transistor, comprising:
      a second gate electrically coupled to the first gate;
      a second source; and
      a second drain;
   a third transistor, comprising:
      a third gate;
      a third source; and
      a third drain electrically coupled to the first drain;
   a first amplifier, comprising:
      a first input electrically coupled to the first drain;
      a second input electrically coupled to the second drain; and
      a first output electrically coupled to the third gate;
   a second amplifier, comprising:
      a third input electrically coupled to the third source;
      a fourth input electrically coupled to the second drain; and
      a second output; and
   a fourth transistor, comprising:
      a fourth gate electrically coupled to the second output;
      a fourth source; and
      a fourth drain electrically coupled to the third source;
   a fifth transistor, comprising:
      a fifth gate electrically coupled to the first gate;
      a fifth source; and
      a fifth drain electrically coupled to the fourth source.

2. The system of claim 1, further comprising:
   a sixth transistor, comprising:
      a sixth drain electrically coupled to the third drain;
      a sixth source electrically coupled to the third drain; and
      a sixth gate electrically coupled to the sixth drain.

3. The system of claim 1, further comprising:
   a third amplifier, comprising:
      a fifth input electrically coupled to the third source;
      a sixth input; and
      a third output electrically coupled to the first gate; and
   a resistor electrically coupled to the fifth input.

4. A system, comprising:
   a first switch having a first drain voltage, the first switch comprising a first transistor, the first transistor comprising:
      a first gate;
      a first source; and
      a first drain;
   a second switch forming a current mirror with the first switch, the second switch having a second drain voltage, the second switch comprising a second transistor, the second transistor comprising:
      a second gate electrically coupled to the first gate;
      a second source; and
      a second drain;
   a third transistor comprising:
      a third gate;
      a third source; and
      a third drain electrically coupled to the first drain;
   a first compensation circuit to adjust the first drain voltage according to the second drain voltage; and
   a second compensation circuit to adjust a current through the first switch according to the second drain voltage, the second compensation circuit comprising a second amplifier, the second amplifier comprising:
      a third input electrically coupled to the third source;
      a fourth input electrically coupled to the second drain; and
      a second output.

5. The system of claim 4, the first compensation circuit comprising a first amplifier, the first amplifier comprising:
   a first input electrically coupled to the first drain;
   a second input electrically coupled to the second drain; and
   a first output electrically coupled to the third gate.

6. The system of claim 4, further comprising a fourth transistor, the fourth transistor comprising:
   a fourth gate electrically coupled to the second output;
   a fourth source; and
   a fourth drain electrically coupled to the third source.

7. The system of claim 6, further comprising a fifth transistor, the fifth transistor comprising:
   a fifth gate electrically coupled to the first gate;
   a fifth source; and
   a fifth drain electrically coupled to the fourth source.

8. The system of claim 7, further comprising a sixth transistor, the sixth transistor comprising:

a sixth drain electrically coupled to the third drain;
a sixth source electrically coupled to the third drain; and
a sixth gate electrically coupled to the sixth drain.

9. The system of claim 7, further comprising
a third amplifier, comprising:
   a fifth input electrically coupled to the third source;
   a sixth input; and
   a third output electrically coupled to the first gate; and
a resistor electrically coupled to the fifth input.

\* \* \* \* \*